(12) United States Patent
Huang et al.

(10) Patent No.: US 12,382,701 B2
(45) Date of Patent: Aug. 5, 2025

(54) METHOD OF FORMING SEMICONDUCTOR DEVICE STRUCTURE WITH GATE STRUCTURE

(71) Applicant: Taiwan Semiconductor Manufacturing Company, Ltd., Hsinchu (TW)

(72) Inventors: Yi-Ching Huang, Taipei (TW); Tsung-Yu Chiang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 155 days.

(21) Appl. No.: 18/311,992

(22) Filed: May 4, 2023

(65) Prior Publication Data
US 2023/0275138 A1 Aug. 31, 2023

Related U.S. Application Data

(60) Continuation of application No. 16/921,187, filed on Jul. 6, 2020, now Pat. No. 11,682,710, which is a
(Continued)

(51) Int. Cl.
*H10D 64/66* (2025.01)
*H10D 30/01* (2025.01)
(Continued)

(52) U.S. Cl.
CPC ....... *H10D 64/518* (2025.01); *H10D 30/0223* (2025.01); *H10D 30/60* (2025.01); *H10D 64/017* (2025.01); *H10D 64/021* (2025.01); *H10D 64/667* (2025.01); *H10D 84/0142* (2025.01); *H10D 84/038* (2025.01); *H10D 84/83* (2025.01)

(58) Field of Classification Search
None
See application file for complete search history.

(56) References Cited

U.S. PATENT DOCUMENTS

| 7,667,271 B2 | 2/2010 | Yu et al. |
| 7,910,453 B2 | 3/2011 | Xu et al. |

(Continued)

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

Structures and formation methods of a semiconductor device structure are provided. The method includes forming a first gate structure over a substrate, and the first gate structure includes a first metal electrode. The method includes forming a second gate structure adjacent to the first gate structure, and the second gate structure includes a second metal electrode. The method also includes forming a mask structure covering the first gate structure and exposing the second gate structure, and etching a portion of the second metal electrode of the second gate structure to form an extending conductive portion. The method includes forming a metal layer over the first gate structure and the extending conductive portion, and etching the metal layer, such that no metal layer is remaining over the first gate structure, and a remaining portion of the metal layer is over the extending conductive portion.

20 Claims, 12 Drawing Sheets

Related U.S. Application Data division of application No. 15/429,797, filed on Feb. 10, 2017, now Pat. No. 10,707,316.

(60) Provisional application No. 62/431,974, filed on Dec. 9, 2016.

(51) Int. Cl.
*H10D 30/60* (2025.01)
*H10D 64/01* (2025.01)
*H10D 64/27* (2025.01)
*H10D 84/01* (2025.01)
*H10D 84/03* (2025.01)
*H10D 84/83* (2025.01)

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2011/0136313 A1 | 6/2011 | Lee et al. |
| 2011/0156107 A1 | 6/2011 | Bohr et al. |
| 2011/0156161 A1 | 6/2011 | Tseng et al. |
| 2011/0272764 A1 | 11/2011 | Kim |
| 2012/0139061 A1 | 6/2012 | Ramachandran et al. |
| 2013/0187236 A1* | 7/2013 | Xie .................. H01L 29/66553 257/369 |
| 2014/0001574 A1 | 1/2014 | Chen et al. |
| 2014/0008720 A1 | 1/2014 | Xie et al. |
| 2014/0103404 A1 | 4/2014 | Li et al. |
| 2014/0110755 A1 | 4/2014 | Colinge |
| 2014/0151812 A1 | 6/2014 | Liaw |
| 2015/0228646 A1 | 8/2015 | Ho et al. |
| 2015/0228648 A1 | 8/2015 | Chi et al. |
| 2015/0311206 A1 | 10/2015 | Hong et al. |
| 2016/0276455 A1 | 9/2016 | Yang et al. |
| 2017/0162675 A1 | 6/2017 | Yim et al. |
| 2017/0194210 A1 | 7/2017 | Oh et al. |

\* cited by examiner

METHOD OF FORMING SEMICONDUCTOR DEVICE STRUCTURE WITH GATE STRUCTURE

CROSS REFERENCE TO RELATED APPLICATIONS

This application is a Continuation application of U.S. patent application Ser. No. 16/921,187, filed on Jul. 6, 2020, which is a Divisional application of U.S. patent application Ser. No. 15/429,797 filed on Feb. 10, 2017 (now U.S. Pat. No. 10,707,316 issued on Jul. 7, 2020), which claims the benefit of U.S. Provisional Application No. 62/431,974, filed on Dec. 9, 2016, and the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since the feature sizes continue to decrease, fabrication processes continue to become more difficult to perform. Therefore, it is a challenge to form reliable semiconductor device structures at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
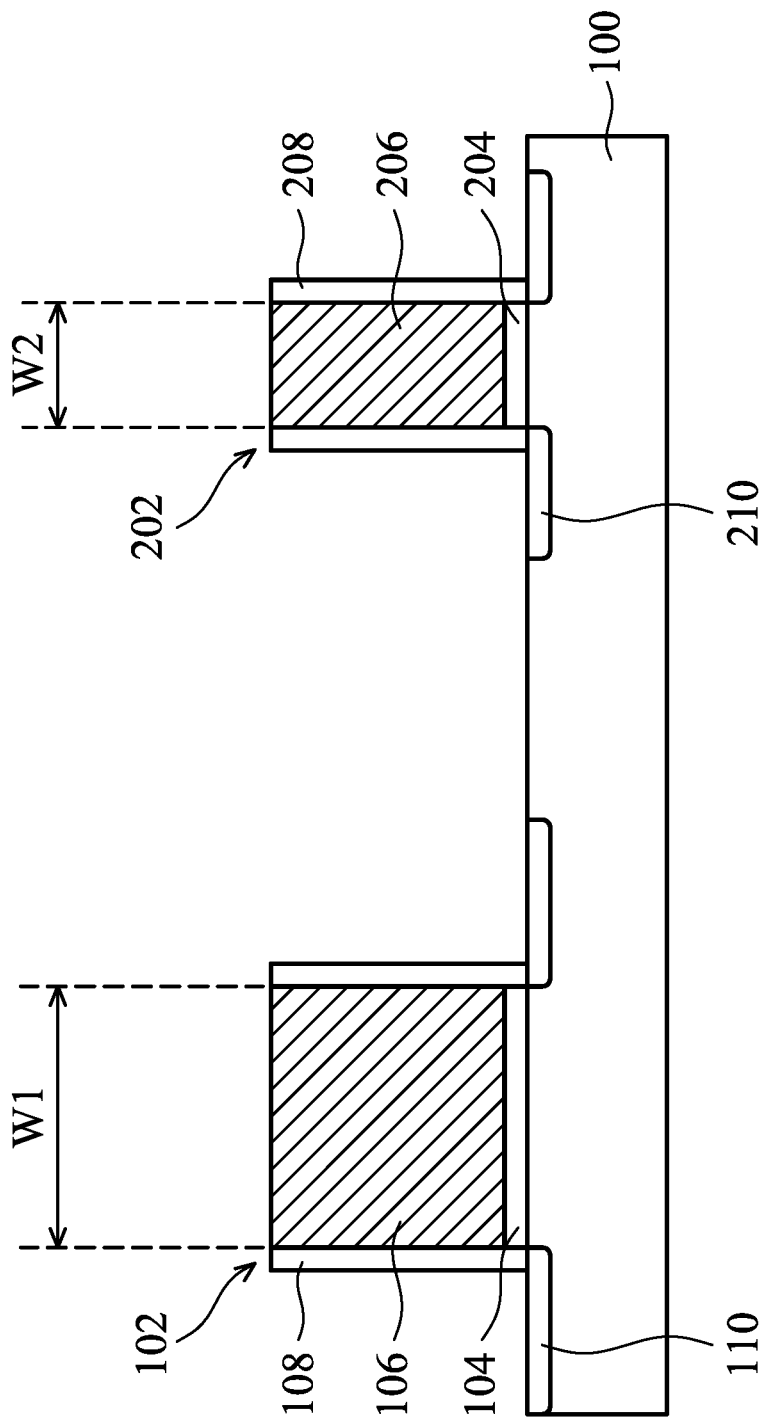
FIG. 1 is a cross-sectional view of a structure in one stage of a manufacturing process of the semiconductor device structure according with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1-11 are cross-sectional views of various stages of a process for forming a semiconductor device structure, in accordance with some embodiments. As shown in FIG. 1, a semiconductor substrate 100 is received or provided, in accordance with some embodiments. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 100 is an un-doped substrate. However, in some other embodiments, the semiconductor substrate 100 is a doped substrate such as a P-type substrate or an N-type substrate.

In some embodiments, the semiconductor substrate 100 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

As shown in FIG. 1, one or more dummy gate structures are formed over the semiconductor substrate 100, in accordance with some embodiments. To simplify the diagram, only two dummy gate structures, namely the first dummy gate structure 102 and the second dummy gate structure 202 are depicted. The semiconductor device structure may include fewer or more dummy gate structures.

As shown in FIG. 1, in some embodiments, the first dummy gate structures 102 have a first width W1, and the second dummy gate structures 202 have a second width W2. As shown in FIG. 1, the first width W1 is greater than the second width W2, in accordance with some embodiments.

In some embodiments, the dummy gate structure 102 is formed in a periphery region or an input/output region of the semiconductor substrate 100, and the dummy gate structure 202 is formed in an active region or a device region of the semiconductor substrate 100.

As shown in FIG. 1, the first dummy gate structure 102 includes a first dummy gate dielectric layer 104 over the semiconductor substrate 100 and a first dummy gate electrode 106 over the first dummy gate dielectric layer 104, in accordance with some embodiments. In some embodiments, as shown in FIG. 1, the second dummy gate structure 202 includes a second dummy gate dielectric layer 204 over the semiconductor substrate 100 and a second dummy gate electrode 206 over the second dummy gate dielectric layer 204.

In some embodiments, each of the first dummy gate dielectric layer 104 and the second dummy gate dielectric layer 204 is made of silicon oxide, silicon nitride, silicon oxynitride, another suitable dielectric material, or a combination thereof. In some embodiments, the first dummy gate dielectric layer 104 and the second dummy gate dielectric layer 204 will be replaced with another dielectric layer such as a high-k dielectric layer in a subsequent process.

In some embodiments, each of the first dummy gate electrode 106 and the second dummy gate electrode 206 is made of polysilicon, another suitable conductive material, or a combination thereof. In some embodiments, the first dummy gate electrode 106 and the second dummy gate electrode 206 will be replaced with another conductive material such as a metal material in a subsequent process.

In some embodiments, a dummy gate dielectric material layer (not shown) and a dummy gate electrode material layer (not shown) are sequentially deposited over the semiconductor substrate 100. In some embodiments, the dummy gate dielectric material layer and the dummy gate electrode material layer are sequentially deposited by using applicable deposition methods. In some embodiments, the applicable deposition methods for depositing the dummy gate dielectric material layer may include a chemical vapor deposition (CVD) process, an atomic layer deposition (ALD) process, a thermal oxidation process, a spin-on coating process, another applicable process, or a combination thereof. In some embodiments, the applicable deposition methods for depositing the dummy gate electrode material layer may include a chemical vapor deposition (CVD) process, a physical vapor deposition (PVD) process, or another applicable method.

Afterwards, according to some embodiments of the present disclosure, the dummy gate dielectric material layer and the dummy gate electrode material layer are patterned to form the first dummy gate structure 102 including the first dummy gate dielectric layer 104 and the first dummy gate electrode 106, and form the second dummy gate structure 202 including the second dummy gate dielectric layer 204 and the second dummy gate electrode 206.

As shown in FIG. 1, two first spacers 108 are formed at opposite sides of the first dummy gate structures 102, and two second spacers 208 are formed at opposite sides of the second dummy gate structures 202, in accordance with some embodiments.

As shown in FIG. 1, the first spacers 108 are formed over sidewalls of the first dummy gate structure 102, in accordance with some embodiments. As shown in FIG. 1, the second spacers 208 are formed over sidewalls of the second dummy gate structure 202, in accordance with some embodiments. In some embodiments, the first spacer 108 and second spacers 208 are made of silicon nitride, silicon oxynitride, silicon carbide, another suitable material, or a combination thereof.

In some embodiments, a spacer layer is deposited over the semiconductor substrate 100, the first dummy gate structures 102 and the second dummy gate structures 202. The spacer layer may be deposited using a CVD process, a PVD process, a spin-on coating process, another applicable process, or a combination thereof. Afterwards, an etching process, such as an anisotropic etching process, is performed to partially remove the spacer layer. As a result, the remaining portions of the spacer layer over the sidewalls of the first dummy gate structure 102 form the first spacers 108, and the remaining portions of the spacer layer over the sidewalls of the second dummy gate structure 202 form the second spacers 208, in accordance with some embodiments.

As shown in FIG. 1, two first source/drain portions 110 are formed at opposite sides of the first dummy gate structure 102 and in the semiconductor substrate 100, in accordance with some embodiments.

In some embodiments, the first source/drain portions 110 are formed by ion implantation. For example, when the first source/drain portions 110 are N-type doped regions, the predetermined region for the first source/drain portions 110 are implanted with phosphorous ions or arsenic ions to form the first source/drain portions 110. In some other embodiments, when the first source/drain portions 110 are P-type doped regions, the predetermined region for the first source/drain portions 110 are implanted with boron ion, indium ion or boron difluoride ion ($BF_2^+$) to form the first source/drain portions 110.

In some embodiments, a portion of the first source/drain portions 110 is near the first dummy gate structure 102 and underneath the first spacer 108. In some other embodiments, the implantation processes are performed at a tilt angle so that the formed first source/drain portions 110 extend under the first dummy gate structure 102.

As shown in FIG. 1, two second source/drain portions 210 are formed at opposite sides of the second dummy gate structure 202 and in the semiconductor substrate 100, in accordance with some embodiments.

In some embodiments, the second source/drain portions 210 are formed by ion implantation. For example, when the second source/drain portions 210 are N-type doped regions, the predetermined region for the second source/drain portions 210 are implanted with phosphorous ions or arsenic ions to form the second source/drain portions 210. In some other embodiments, when the second source/drain portions 210 are P-type doped regions, the predetermined region for the second source/drain portions 210 are implanted with boron ion, indium ion or boron difluoride ion ($BF_2^+$) to form the second source/drain portions 210.

In some embodiments, a portion of the second source/drain portions 210 is near the second dummy gate structure 202 and underneath the second spacer 208. In some other embodiments, the implantation processes are performed at a tilt angle so that the formed second source/drain portions 210 extend under the second dummy gate structure 202.

In some embodiments, after the first source/drain portions 110 and the second source/drain portions 210 are formed by one or more implantation processes, an annealing process, such as a rapid thermal process (RTP), are performed to repair the crystal structure of the silicon in the first source/drain portions 110 and the second source/drain portions 210 and activate the dopant in the first source/drain portions 110 and the second source/drain portions 210.

Figure 2:
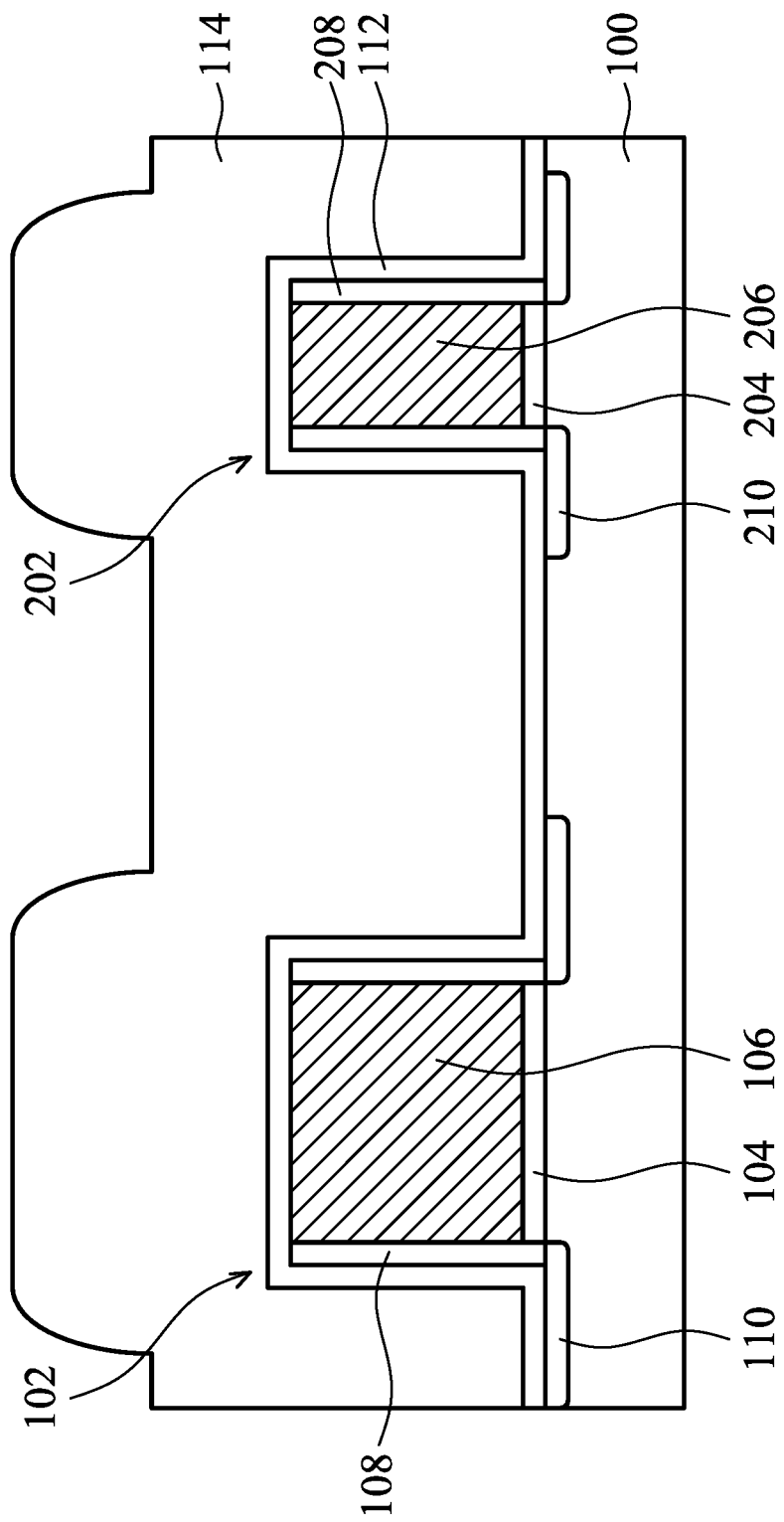
FIG. 2 is a cross-sectional view of a structure in one stage of a manufacturing process of the semiconductor device structure according with some embodiments of the present disclosure.

Afterwards, as shown in FIG. 2, an etch stop layer 112 is deposited over the semiconductor substrate 100, the first dummy gate structures 102, the second dummy gate structures 202, the first spacers 108 and second spacers 208, as shown in FIG. 2 in accordance with some embodiments. In some embodiments, the etch stop layer 112 is conformally deposited over the semiconductor substrate 100, the first dummy gate structures 102, the second dummy gate structures 202, the first spacers 108 and second spacers 208.

In some embodiments, the etch stop layer 112 is made of silicon nitride, silicon oxynitride, silicon carbide, another suitable material, or a combination thereof. In some embodiments, the etch stop layer 112 is formed by using a suitable process, such as a CVD process.

Afterwards, as shown in FIG. 2, in some embodiments, a dielectric material layer 114 is deposited to cover the etch stop layer 112, the semiconductor substrate 100, the first dummy gate structures 102, the second dummy gate structures 202, the first spacers 108 and second spacers 208. In some embodiments, the dielectric material layer 114 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer 114 is deposited using a CVD process, an ALD process, a spin-on process, a spray coating process, another applicable process, or a combination thereof.

Figure 3:
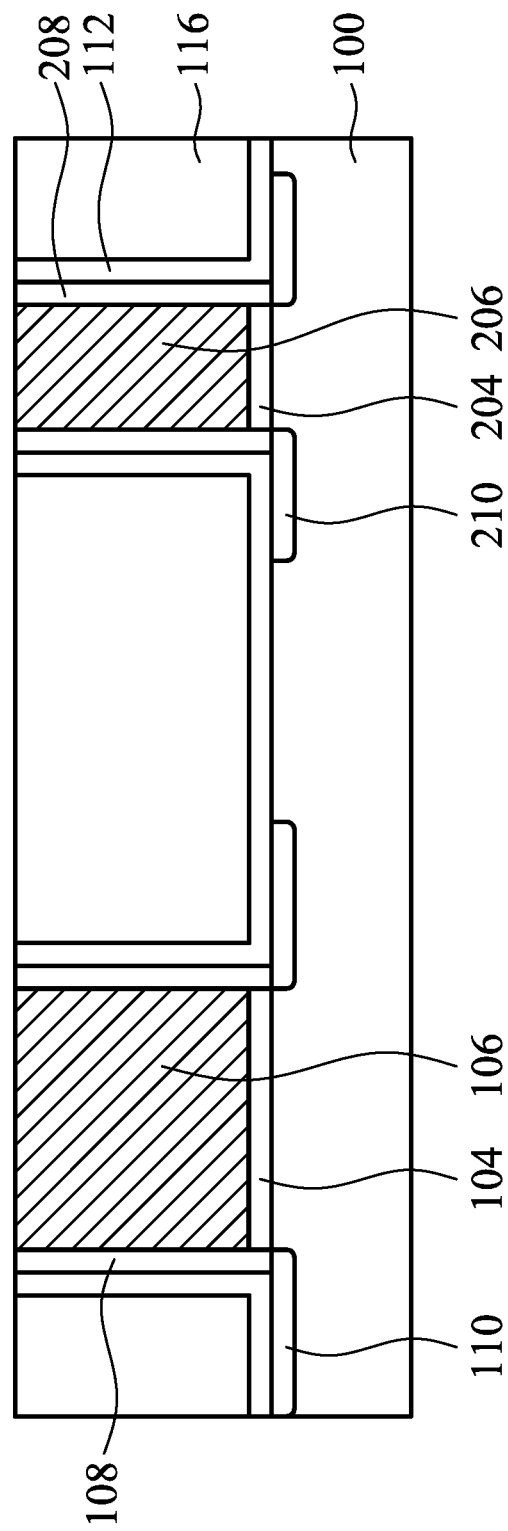
FIG. 3 is a cross-sectional view of a structure in one stage of a manufacturing process of the semiconductor device structure according with some embodiments of the present disclosure.

Afterwards, as shown in FIG. 3, a planarization process is used to thin down and partially remove the dielectric material layer 114, in accordance with some embodiments. The dielectric material layer 114 may be partially removed until the first dummy gate structures 102 and the second dummy gate structures 202 are exposed. As a result, the remaining portion of the dielectric material layer 114 forms the first dielectric layer 116. In some embodiments, the planarization process includes a CMP process, a grinding process, a dry polishing process, an etching process, another applicable process, or a combination thereof.

As shown in FIG. 3, the first dielectric layer 116 surrounds the first dummy gate structures 102, the second dummy gate structures 202, the first spacer 108 and second spacers 208, in accordance with some embodiments.

Figure 4:
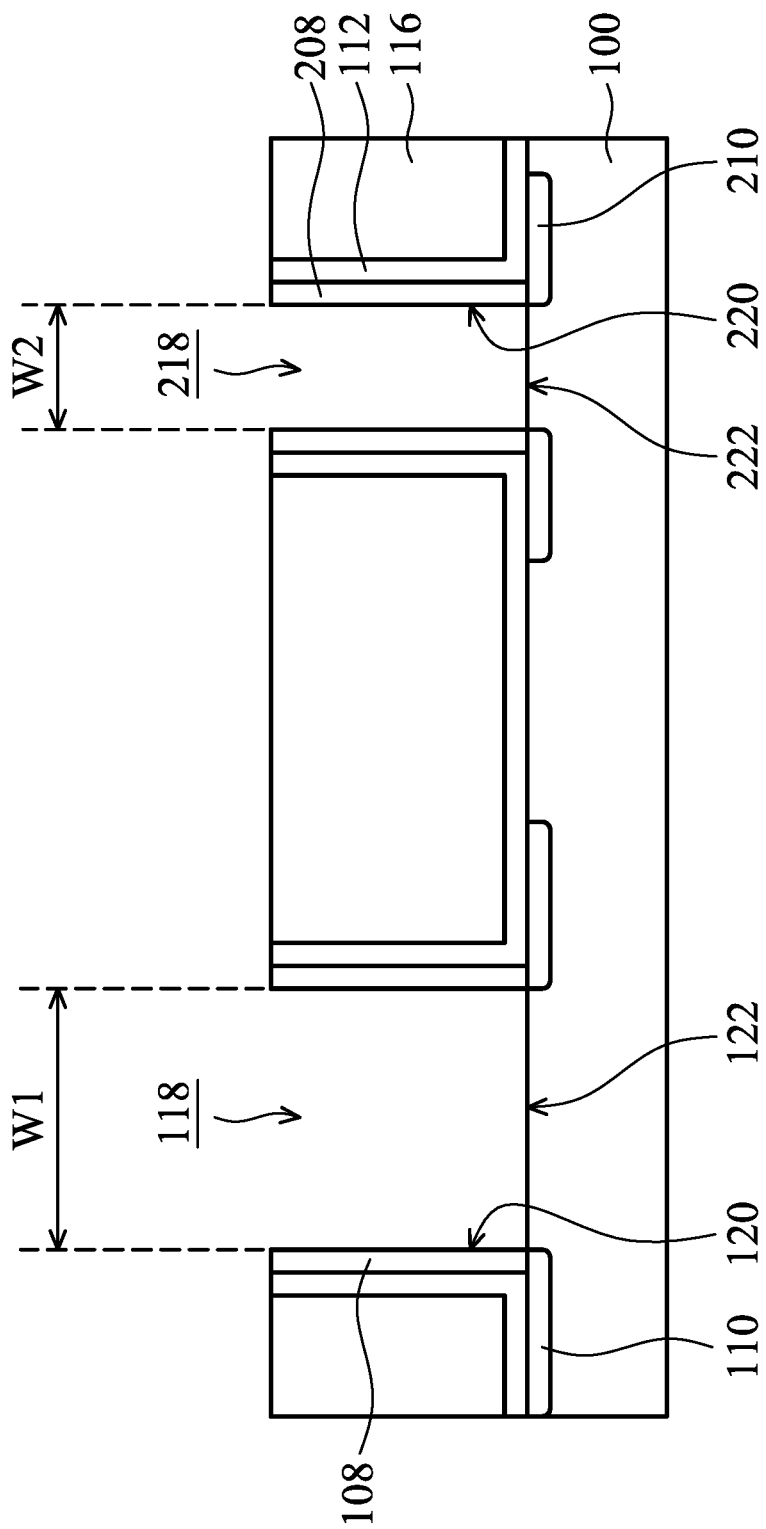
FIG. 4 is a cross-sectional view of a structure in one stage of a manufacturing process of the semiconductor device structure according with some embodiments of the present disclosure.
Figure 5:
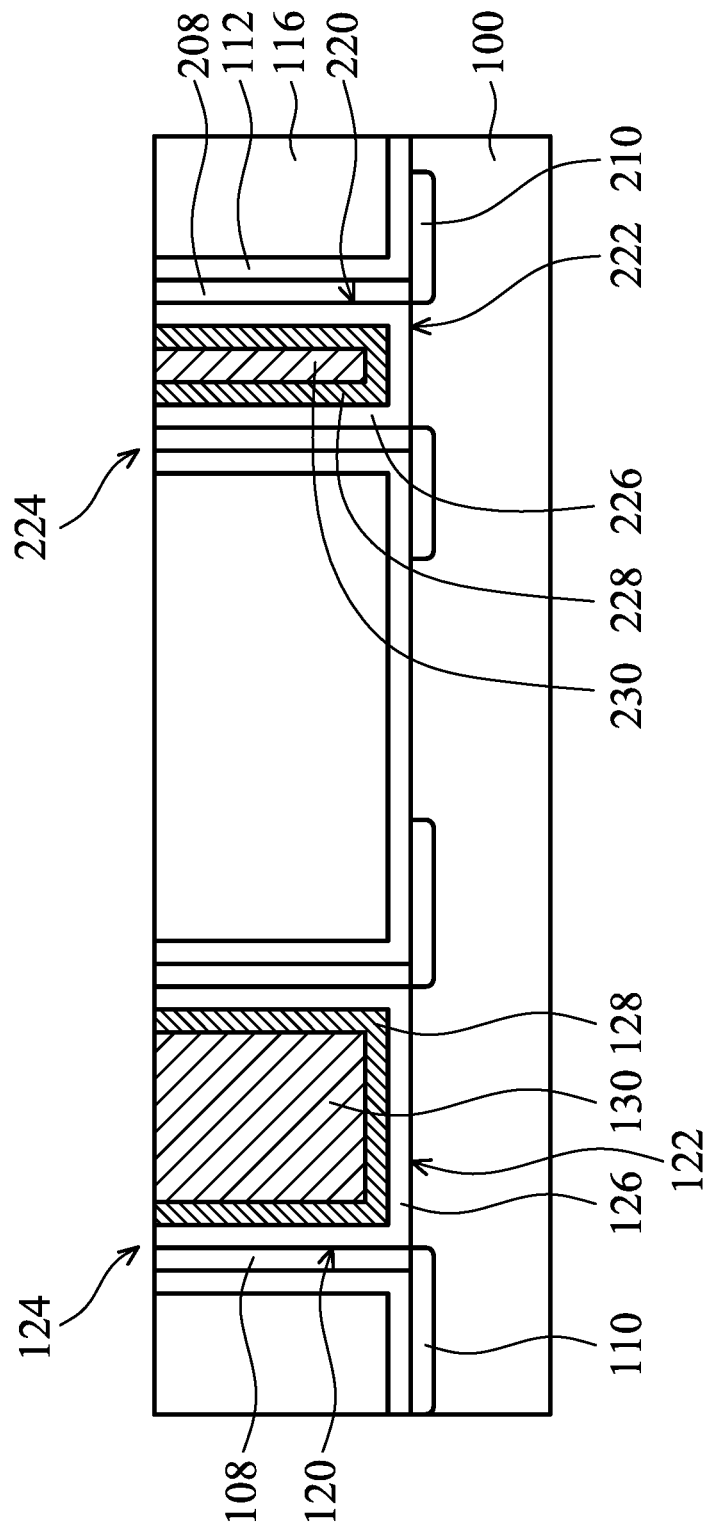
FIG. 5 is a cross-sectional view of a structure in one stage of a manufacturing process of the semiconductor device structure according with some embodiments of the present disclosure.

In some embodiments, one or more metal gate replacement processes is/are subsequently performed to replace the first dummy gate structures 102 and the second dummy gate structures 202, as shown in FIGS. 4-5 in accordance with some embodiments.

As shown in FIG. 4, the first dummy gate structure and the second dummy gate structure are removed to form a first trench 118 and a second trench 218 in the first dielectric layer 116. In some embodiments, the first trench 118 has the first width W1, and the second trench 218 has the second width W2. As shown in FIG. 4, the second width W2 is less than the first width W1.

As shown in FIG. 4, the first trench 118 exposes first sidewalls 120 of the first spacers 108 and a first portion 122 of the top surface of the semiconductor substrate 100, in accordance with some embodiments.

As shown in FIG. 4, the second trench 218 exposes second sidewalls 220 of the second spacers 208 and a second portion 222 of the top surface of the semiconductor substrate 100, in accordance with some embodiments.

As shown in FIG. 4, the first trench 118 is between the two first spacers 108, in accordance with some embodiments. As shown in FIG. 4, the second trench 218 is between the two second spacers 208, in accordance with some embodiments.

Afterwards, as shown in FIG. 5, a first metal gate structure 124 is formed in the first trench 118, and a second metal gate structure 224 is formed in the second trench 218, in accordance with some embodiments. As shown in FIG. 5, the first metal gate structure 124 includes a first gate dielectric material layer 126 conformally lining the first sidewalls 120 of the first spacers 108 and the first portion 122 of the top surface of the semiconductor substrate 100, in accordance with some embodiments. As shown in FIG. 5, the first metal gate structure 124 further includes a first work function material layer 128 conformally lining the first gate dielectric material layer 126, in accordance with some embodiments. As shown in FIG. 5, the first metal gate structure 124 further includes a first metal material electrode 130 positioned over the first work function material layer 128, in accordance with some embodiments.

As shown in FIG. 5, the second metal gate structure 224 includes a second gate dielectric material layer 226 conformally lining the second sidewalls 220 of the second spacers 208 and the second portion 222 of the top surface of the semiconductor substrate 100, in accordance with some embodiments. As shown in FIG. 5, the second metal gate structure 224 further includes a second work function material layer 228 conformally lining the second gate dielectric material layer 226, in accordance with some embodiments. As shown in FIG. 5, the second metal gate structure 224 further includes a second metal material electrode 230 positioned over the second work function material layer 228, in accordance with some embodiments.

In some embodiments, the materials of the first gate dielectric material layer 126 and the second gate dielectric material layer 226 are the same. In some embodiments, the first gate dielectric material layer 126 and the second gate dielectric material layer 226 are made of a high-K dielectric material. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$(BST), $Al_2O_3$, another suitable high-k dielectric material, or a combination thereof.

The first work function material layer 128 and the second work function material layer 228 are used to provide the desired work function for transistors to enhance device performance.

In some embodiments, the first work function material layer 128 is made of n-type work function material layers capable of providing a work function value suitable for the device, such as equal to or less than about 4.5 eV. In some embodiments, the first work function material layer 128 is made of p-type work function material layers capable of providing a work function value suitable for the device, such as equal to or greater than about 4.8 eV.

In some embodiments, the second work function material layer 228 is made of n-type work function material layers capable of providing a work function value suitable for the device, such as equal to or less than about 4.5 eV. In some embodiments, the second work function material layer 228 is made of p-type work function material layers capable of providing a work function value suitable for the device, such as equal to or greater than about 4.8 eV.

In some embodiments, the first work function material layer 128 and the second work function material layer 228 are work function material layers of the same type, such as the n-type work function material layer. In some other embodiments, the first work function material layer 128 is a work function material layer of a different type than that of the second work function material layer 228. For example, the first work function material layer 128 is an n-type work function material layer, whereas the second work function material layer 228 is a p-type work function material layer.

The n-type work function material layer may include metal, metal carbide, metal nitride, or a combination thereof. For example, the n-type work function material layer includes titanium nitride, tantalum, tantalum nitride, another suitable material, or a combination thereof. The p-type work function material layer may include metal, metal carbide, metal nitride, another suitable material, or a combination thereof. For example, the p-type metal includes tantalum nitride, tungsten nitride, titanium, titanium nitride, another suitable material, or a combination thereof.

The thickness and/or the compositions of the first work function material layer 128 and the second work function material layer 228 may be fine-tuned to adjust the work function level. For example, a titanium nitride layer may be used as a p-type work function material layer or an n-type work function material layer, depending on the thickness and/or the compositions of the titanium nitride layer.

In some embodiments, the materials of the first metal material electrode 130 and the second metal material electrode 230 are the same. In some embodiments, the first metal material electrode 130 and the second metal material electrode 230 are made of tungsten, copper, aluminum, titanium, cobalt, tantalum, gold, chromium, nickel, platinum, iridium, rhodium, an alloy thereof, another conductive material, or a combination thereof.

In some embodiments, multiple layers are deposited over the dielectric layer 116 and fill the first trench 118 and the second trench 218. In some embodiments, a gate dielectric material layer and a work function material layer are conformally deposited over the dielectric layer 116 and lining the first trench 118 and the second trench 218. Afterward, in some embodiments, a metal material layer is blanketly deposited over the dielectric layer 116 and fills the first trench 118 and the second trench 218. In some embodiments of the present disclosure, the gate dielectric material layer is deposited by using a chemical vapor deposition (CVD) process, a physical vapor deposition (PVD) process, a spin-on process, another applicable process, or a combination thereof. In some embodiments of the present disclosure, the work function material layer is deposited by using an applicable deposition process. The applicable deposition process may include a PVD process, a plating process, a CVD process, another applicable process, or a combination thereof. In some embodiments of the present disclosure, the metal material layer is deposited by using an applicable deposition process. The applicable deposition process may include a PVD process, a plating process, a CVD process, another applicable process, or a combination thereof.

Afterwards, a planarization process is performed to remove the portions of the gate dielectric material layer, the work function material layer and the metal material layer outside of the first trench 118 and the second trench 218. In some embodiments, the remaining portions of the gate dielectric material layer, the work function material layer and the metal material layer in the first trench 118 form the first gate dielectric material layer 126, the first work function material layer 128 and the first metal material electrode 130, respectively. In some embodiments, the remaining portions of the gate dielectric material layer, the work function material layer and the metal material layer in the second trench 128 form the second gate dielectric material layer 226, the second work function material layer 228 and the second metal material electrode 230, respectively.

Figure 6:
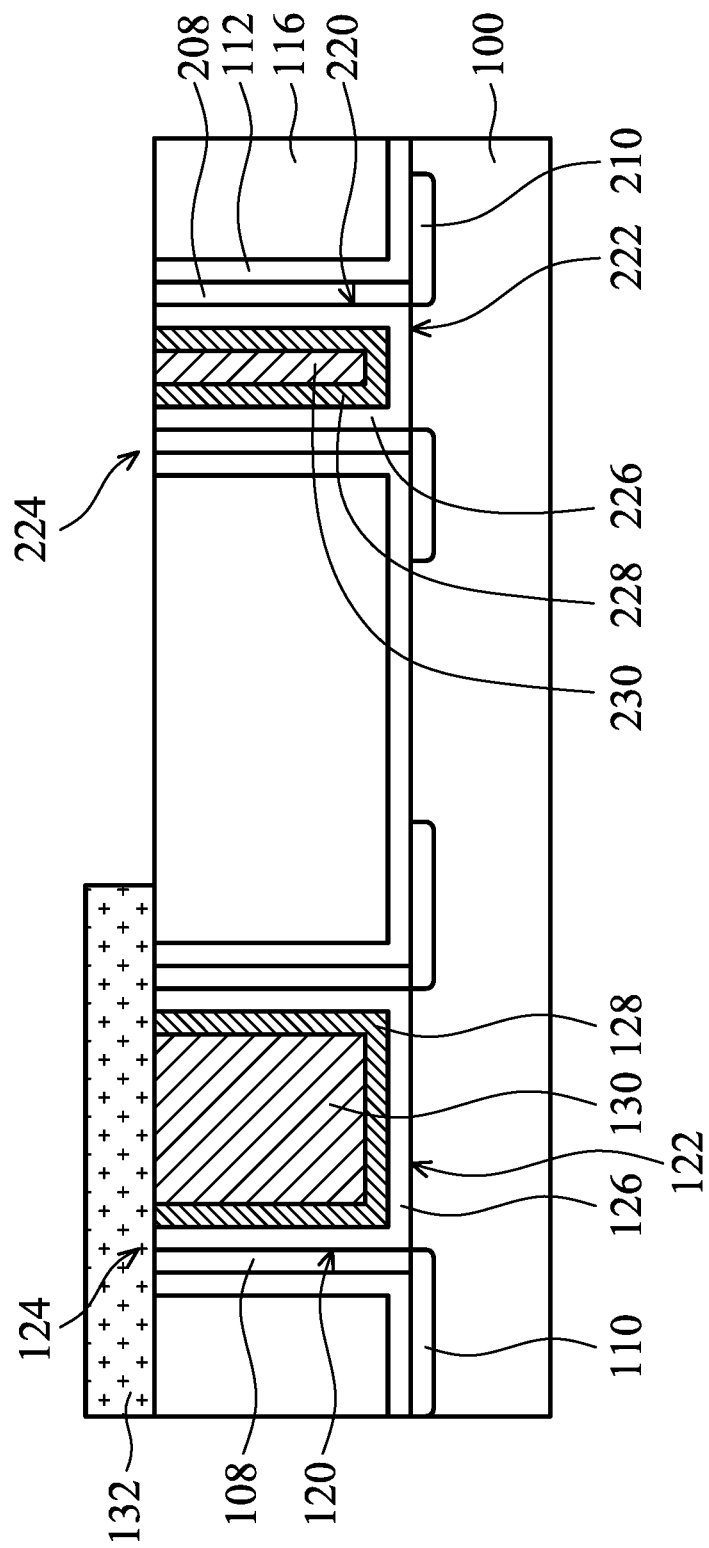
FIG. 6 is a cross-sectional view of a structure in one stage of a manufacturing process of the semiconductor device structure according with some embodiments of the present disclosure.

Afterwards, as shown in FIG. 6, a mask structure 132 is formed over the first dielectric layer 116, in accordance with some embodiments. As shown in FIG. 6, the mask structure 132 covers the first metal gate structure 124 and exposes the second metal gate structure 224, in accordance with some embodiments.

In some embodiments, the mask structure 132 is made of a dielectric material. The dielectric material may include silicon oxide, silicon nitride, silicon oxynitride, silicon carbide, another suitable dielectric material, or a combination thereof.

In some embodiments, a mask material layer is deposited over the dielectric layer 116, the first metal gate structure 124 and the second metal gate structure 224. The mask material layer may be deposited by using a chemical vapor deposition (CVD) process, a physical vapor deposition (PVD) process, a spin-on process, another applicable process, or a combination thereof. Afterwards, the mask material layer is partially removed by using a photolithography process and an etching process. For example, a patterned photoresist layer (not shown) is formed on the mask material layer. The portion of the mask material layer not covered by the photoresist layer is etched. As a result, the mask structure 132 is formed.

Figure 7:
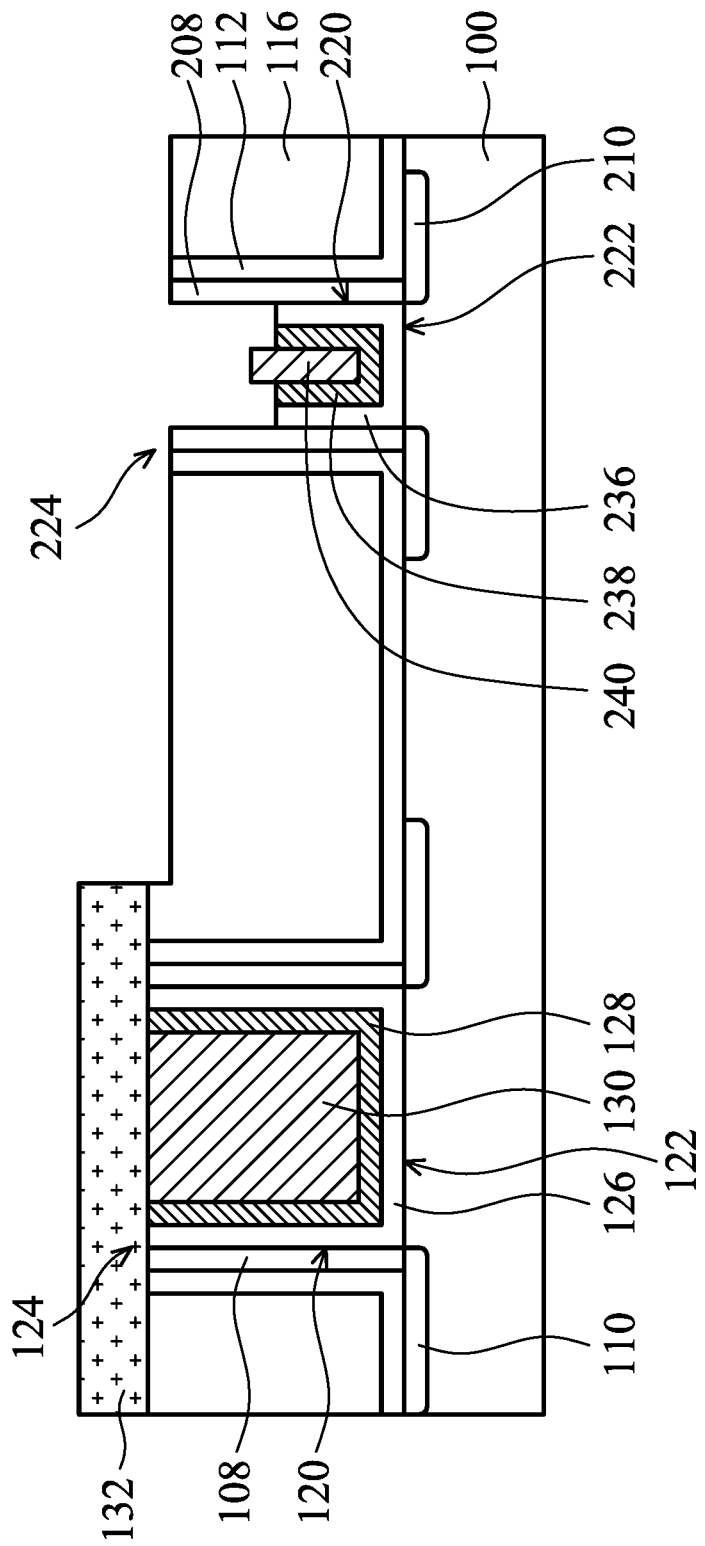
FIG. 7 is a cross-sectional view of a structure in one stage of a manufacturing process of the semiconductor device structure according with some embodiments of the present disclosure.

Afterwards, as shown in FIG. 7, the second gate dielectric material layer 226, the second work function material layer 228, and the second metal material electrode 230 of the second metal gate structure 224 are etched, in accordance with some embodiments. As shown in FIG. 7, a remaining portion of the second gate dielectric material layer 226 forms a second gate dielectric layer 236 of the second metal gate structure 224 lining the second sidewalls 220 of the second spacers 208 and the second portion 222 of the top surface of the semiconductor substrate 100, in accordance with some embodiments. As shown in FIG. 7, a remaining portion of the second work function material layer 228 forms a second work function layer 238 of the second metal gate structure 224 conformally lining the second gate dielectric layer 236, in accordance with some embodiments. As shown in FIG. 7, a remaining portion of the second metal material electrode 230 forms a first conductive portion 240 of the second metal gate structure 224, in accordance with some embodiments.

As shown in FIG. 7, the portion of the first dielectric layer 116 exposed by the mask structure 132 is partially etched during the etching process which etches the second gate dielectric material layer 226, the second work function material layer 228, and the second metal material electrode 230 of the second metal gate structure 224, in accordance with some embodiments. As shown in FIG. 7, the two second spacers 208 exposed by the mask structure 132 are partially etched during the etching process which etches the second gate dielectric material layer 226, the second work function material layer 228, and the second metal material electrode 230 of the second metal gate structure 224, in accordance with some embodiments. As shown in FIG. 7, the portion of the etch stop layer 112 exposed by the mask structure 132 is partially etched during the etching process which etches the second gate dielectric material layer 226, the second work function material layer 228, and the second metal material electrode 230 of the second metal gate structure 224, in accordance with some embodiments.

In some embodiments, the etching process may include a wet etching process, a dry etching process, or a combination thereof. In some embodiments, the dry etching process uses a suitable etchant. An example of the etchant may include gaseous $Cl_2$, $NF_3$, $SiCl_4$, $BCl_3$, HBr, Na, and/or $O_2$, another suitable etchant, or a combination thereof.

In some embodiments, after the etching process which etches the second gate dielectric material layer 226, the second work function material layer 228, and the second metal material electrode 230 of the second metal gate structure 224, the second work function layer 238 may reach the designed height.

Figure 8:
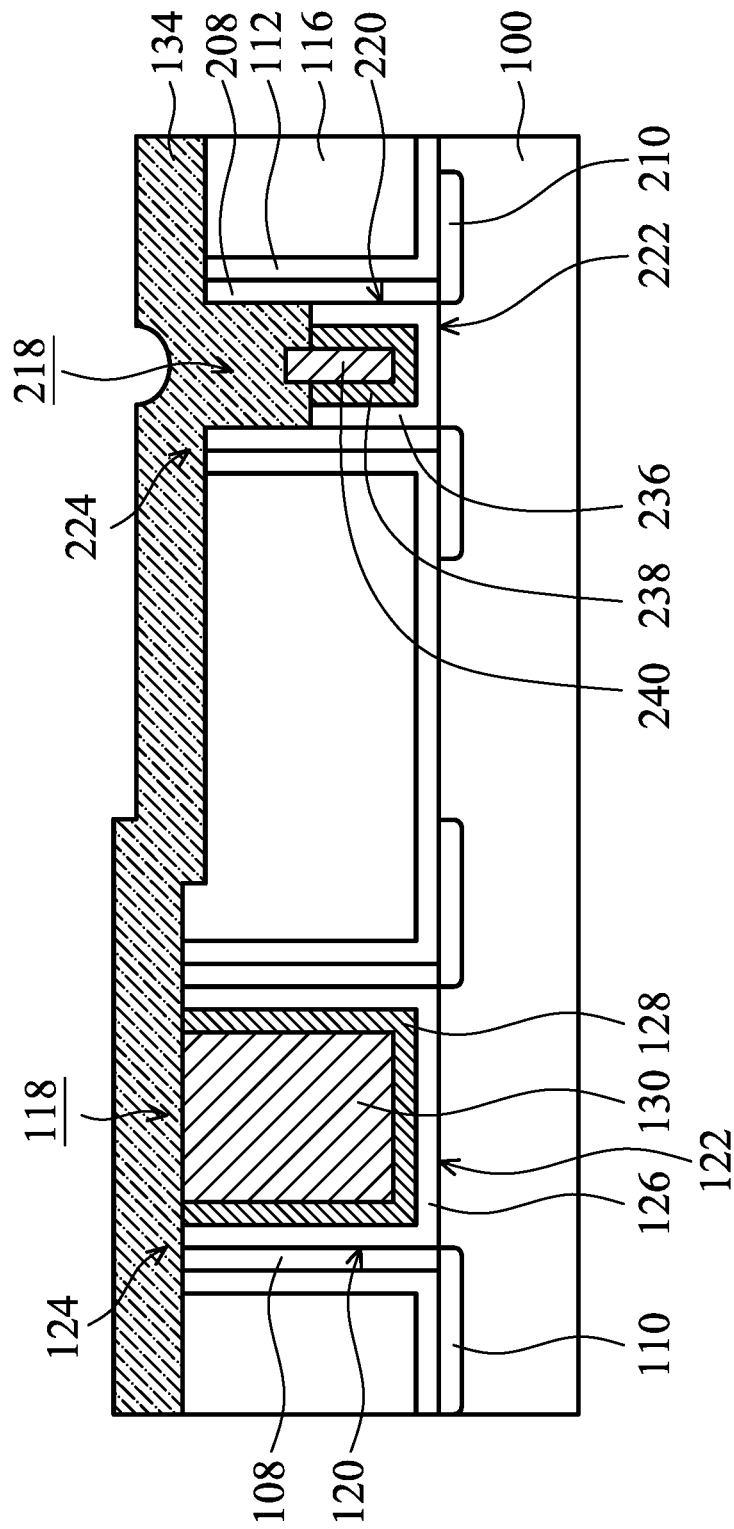
FIG. 8 is a cross-sectional view of a structure in one stage of a manufacturing process of the semiconductor device structure according with some embodiments of the present disclosure.

Afterwards, as shown in FIG. 8, the mask structure 132 is removed to expose the first metal gate structure 124, in accordance with some embodiments. In some embodiments, an etching process is used to remove the mask structure 132. The etching process may include a wet etching process, a dry etching process, or a combination thereof.

Afterwards, as shown in FIG. 8, a metal layer 134 is deposited over the first dielectric layer 116, the first trench 118, the second trench 218, the first metal gate structure 124 and the second metal gate structure 224, in accordance with some embodiments. As shown in FIG. 8, a metal layer 134 fills the second trench 218, in accordance with some embodiments. As shown in FIG. 8, the metal layer 134 does not fill into the first trench 118. As shown in FIG. 8, the metal layer 134 covers the second gate dielectric layer 236, the second work function layer 238, and the first conductive portion 240 of the second metal gate structure 224, in accordance with some embodiments.

In some embodiments, the metal layer 134 is made of tungsten, copper, aluminum, titanium, cobalt, tantalum, gold, chromium, nickel, platinum, iridium, rhodium, an alloy thereof, another conductive material, or a combination thereof. In some embodiments, the metal layer 134 is deposited over the first dielectric layer 116, the first trench 118, the second trench 218, the first metal gate structure 124 and the second metal gate structure 224 by using an applicable deposition process. The applicable deposition process may include a PVD process, a plating process, a CVD process, another applicable process, or a combination thereof. In some embodiments, the materials of the metal layer 134 and the first conductive portion 240 are the same.

Figure 9:
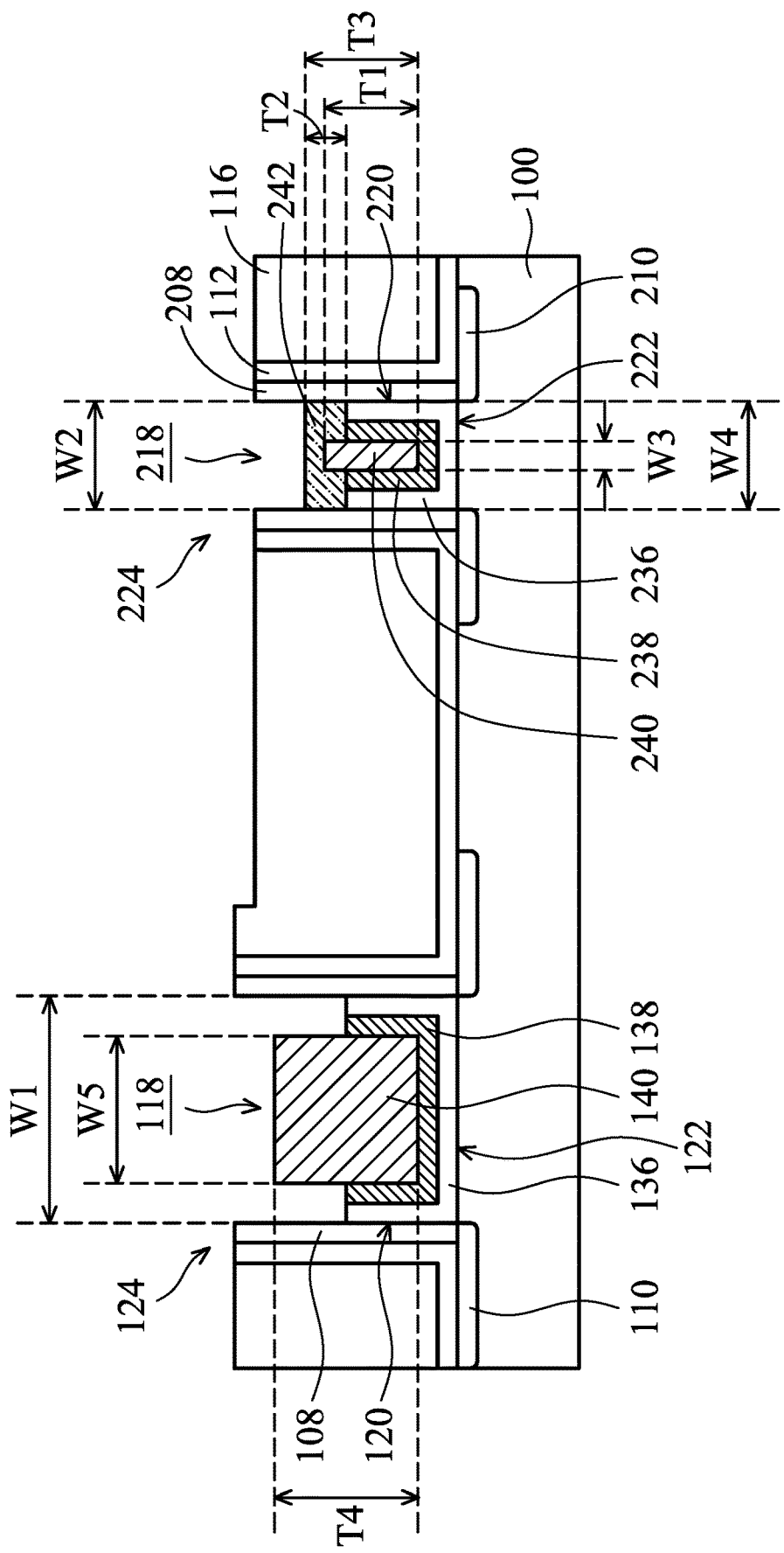
FIG. 9 is a cross-sectional view of a structure in one stage of a manufacturing process of the semiconductor device structure according with some embodiments of the present disclosure.

Afterwards, as shown in FIG. 9, the metal layer 134 is etched, in accordance with some embodiments. As shown in FIG. 9, the portion of the metal layer 134 outside the second trench 218 is removed, in accordance with some embodiments. As shown in FIG. 9, no metal layer 134 remains over the first trench 118 after etching the metal layer 134, in accordance with some embodiments.

As shown in FIG. 9, a portion of the metal layer 134 in the second trench 218 is removed, in accordance with some embodiments. As shown in FIG. 9, a remaining portion of the metal layer 134 over the first conductive portion 240 and in the second trench 218 forms a second conductive portion 242 over the first conductive portion 240, in accordance with some embodiments.

In some embodiments, the etching process may include a wet etching process, a dry etching process, or a combination thereof. In some embodiments, the dry etching process uses a suitable etchant. An example of the etchant may include gaseous $Cl_2$, $NF_3$, $SiCl_4$, $BCl_3$, HBr, Na, and/or $O_2$, another suitable etchant, or a combination thereof.

As shown in FIG. 9, the first conductive portion 240 and the second conductive portion 242 together form a second metal electrode of the second metal gate structure 224, in accordance with some embodiments.

As shown in FIG. 9, during the etching process which etches the metal layer 134 and forms the second conductive portion 242, the first gate dielectric material layer 126 of the first metal gate structure 124 is also etched, in accordance with some embodiments. As shown in FIG. 9, a remaining portion of the first gate dielectric material layer 126 forms a first gate dielectric layer 136 lining the first sidewalls 120 of the first spacers 108 and the first portion 122 of the top surface of the semiconductor substrate 100, in accordance with some embodiments.

As shown in FIG. 9, during the etching process which etches the metal layer 134 and forms the second conductive portion 242, the first work function material layer 128 is also etched, in accordance with some embodiments. As shown in FIG. 9, a remaining portion of the first work function material layer 128 forms a first work function layer 138 conformally lining the first gate dielectric layer 136, in accordance with some embodiments.

As shown in FIG. 9, during the etching process which etches the metal layer 134 and forms the second conductive portion 242, the first metal material electrode 130 of the first metal gate structure 124 is also etched, in accordance with some embodiments. As shown in FIG. 9, a remaining portion of the first metal material electrode 130 forms a first metal electrode 140 of the first metal gate structure 124 over the first work function layer 138, in accordance with some embodiments.

In some cases, if the first work function layer, the first metal electrode, the second work function layer and the second metal electrode of the second metal gate structure are formed by a single etching process which etches the structure shown in FIG. 5, the second metal electrode of the second metal gate structure may merely include the first conductive portion shown in FIG. 7. Therefore, the resistance of the second metal gate structure may be high.

In contrast, in some embodiments, the first metal electrode 140, the first work function layer 138, the second work function layer 238 and the second metal electrode of the second metal gate structure 224 are formed by the etching-depositing-etching processes shown in FIGS. 7-9.

Therefore, in some embodiments, the second metal electrode of the second metal gate structure 224 includes the first conductive portion 240 and the second conductive portion 242. The amount of metal in the second metal electrode may be increased. Therefore, the resistance of the second metal gate structure may be reduced, in accordance with some embodiments.

In some cases, the first work function layer, the first metal electrode, the second work function layer and the second metal electrode of the second metal gate structure are formed by a single etching process which etches the structure shown in FIG. 5. However, in these cases, the first work function layer may be over-etched while the second work function layer reaches the designed height.

In contrast, in some embodiments, the first work function layer 138, the first metal electrode 140, the second work function layer 238 and the second metal electrode of the second metal gate structure 224 are formed by the etching-depositing-etching processes shown in FIGS. 7-9. Therefore, in some embodiments, the first work function layer 138 and the second work function layer 238 are formed by two different etching processes. Therefore, both the first work function layer 138 and the second work function layer 238 may reach the designed height. Therefore, device reliability may be improved.

As shown in FIG. 9, the first metal gate structure 124 is positioned in a first dielectric layer 116 and over the semiconductor substrate 100, in accordance with some embodiments. As shown in FIG. 9, the second metal gate structure 224 is positioned in the first dielectric layer 116 and over the semiconductor substrate 100, in accordance with some embodiments.

As shown in FIG. 9, the two first source/drain portions 110 are positioned at opposite sides of the first metal gate structure 124, in accordance with some embodiments. As shown in FIG. 9, the two second source/drain portions 210 are positioned at opposite sides of the second metal gate structure 224, in accordance with some embodiments. As shown in FIG. 9, two first spacers 108 are positioned at opposite sides of the first metal gate structure 124, in accordance with some embodiments. As shown in FIG. 9, two second spacers 208 are positioned at opposite sides of the second metal gate structure 224, in accordance with some embodiments.

As shown in FIG. 9, the first metal gate structure 124 has a first width W1, and the second metal gate structure 224 has a second width W2, in accordance with some embodiments. As shown in FIG. 9, the first width W1 is greater than the second width W2, in accordance with some embodiments.

As shown in FIG. 9, the first conductive portion 240 has a third width W3, and the second conductive portion 242 has a fourth width W4, in accordance with some embodiments. As shown in FIG. 9, the fourth width W4 is greater than the third width W3, in accordance with some embodiments. As shown in FIG. 9, the first conductive portion 240 has a first thickness T1 greater than the third width W3 of the first conductive portion 240, in accordance with some embodiments. As shown in FIG. 9, the second conductive portion 242 has a second thickness T2 that is less than the fourth width W4 of the second conductive portion 242, in accordance with some embodiments. As shown in FIG. 9, the first thickness T1 is greater than the second thickness T2, in accordance with some embodiments.

As shown in FIG. 9, the second metal electrode of the second metal gate structure 224 formed by the first conductive portion 240 and the second conductive portion 242 has a third thickness T3 that is less than the sum of the first thickness T1 and the second thickness T2, in accordance with some embodiments.

As shown in FIG. 9, the second metal electrode of the second metal gate structure 224 formed by the first conductive portion 240 and the second conductive portion 242 is a T-shaped metal electrode, in accordance with some embodiments.

As shown in FIG. 9, the fourth width W4 of the second conductive portion 242 is substantially equal to the second width W2 of the second trench 218, and the second conductive portion 242 of the second metal electrode of the second metal gate structure 224 is in contact with the two second spacers 208, in accordance with some embodiments. As shown in FIG. 9, the first metal electrode 140 has a fifth width W5, and the fifth width W5 is less than the first width W1 of the first trench 118 of the first metal gate structure 124, in accordance with some embodiments. As shown in FIG. 9, the first metal electrode 140 of the first metal gate structure 124 does not come into contact with the two first spacers 108, in accordance with some embodiments.

As shown in FIG. 9, the fifth width W5 is greater than the fourth width W4 of the second conductive portion 242 of the second metal electrode, in accordance with some embodiments. As shown in FIG. 9, the first metal electrode 140 has a rectangular cross-section, in accordance with some embodiments. As shown in FIG. 9, the first metal electrode 140 has a fourth thickness T4 that is greater than the third thickness T3 of the second metal electrode of the second metal gate structure 224, in accordance with some embodiments. As shown in FIG. 9, the height of the first metal electrode 140 is higher than the height of the second metal electrode of the second metal gate structure 224, in accordance with some embodiments.

In some embodiments, about 40% to about 100% of the fourth thickness T4 of the first metal electrode 140 is covered by the first work function layer 138. In some embodiments, about 60% to about 80% of the fourth thickness T4 of the first metal electrode 140 is covered by the first work function layer 138.

Figure 10:
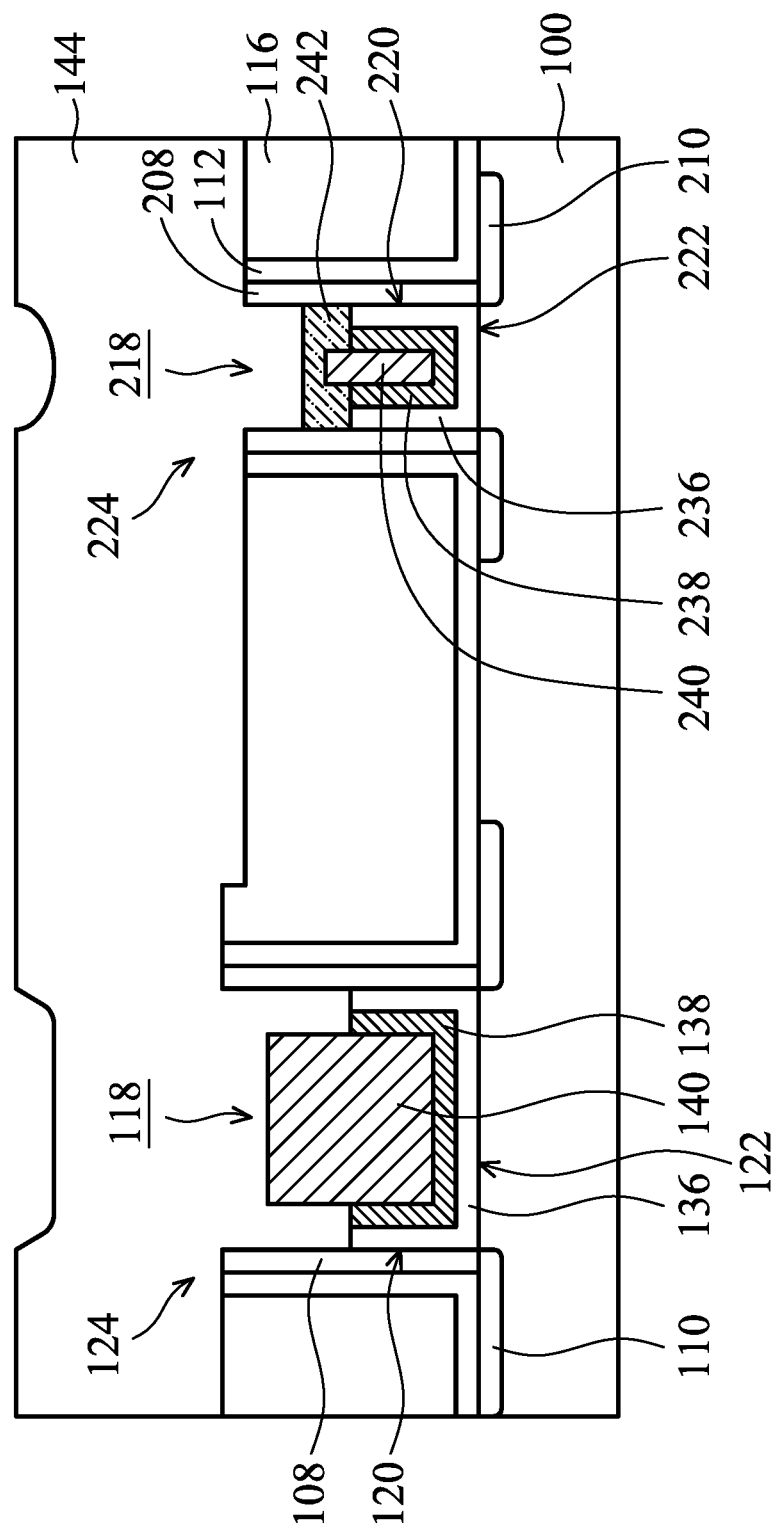
FIG. 10 is a cross-sectional view of a structure in one stage of a manufacturing process of the semiconductor device structure according with some embodiments of the present disclosure.

Afterwards, as shown in FIG. 10, a second dielectric layer 144 is deposited over the first dielectric layer 116, the first metal gate structure 124 and the second metal gate structure 224, in accordance with some embodiments. As shown in FIG. 10, the second dielectric layer 144 fills the first trench 118 and the second trench 218, in accordance with some embodiments. As shown in FIG. 10, the second dielectric layer 144 covers the first metal gate structure 124 and the second metal gate structure 224, in accordance with some embodiments.

In some embodiments, the second dielectric layer 144 is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the second dielectric layer 144 is deposited using a CVD process, an ALD process, a spin-on process, a spray coating process, another applicable process, or a combination thereof.

Figure 11:
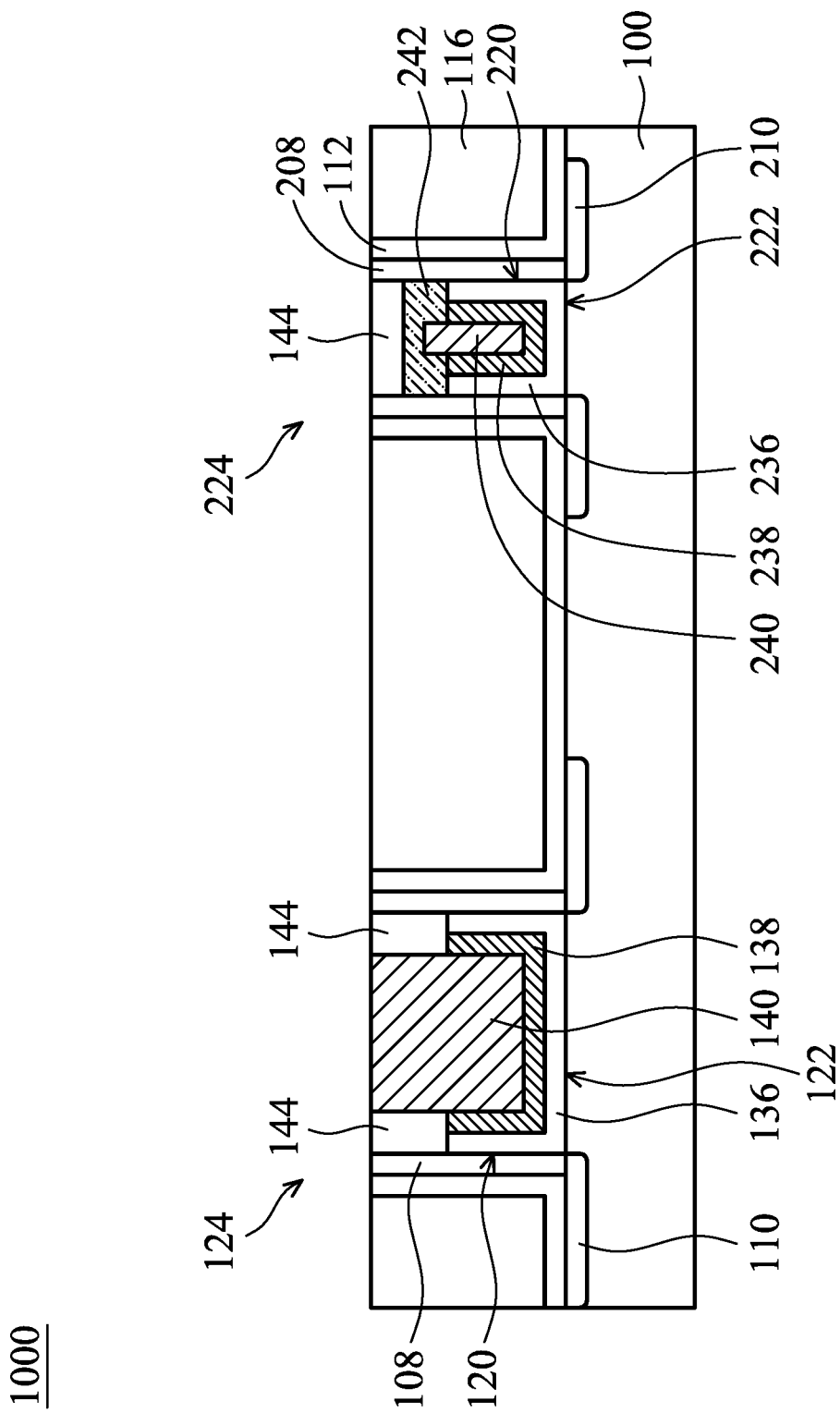
FIG. 11 is a cross-sectional view of a structure in one stage of a manufacturing process of the semiconductor device structure according with some embodiments of the present disclosure.

Afterwards, as shown in FIG. 11, the second dielectric layer 144 is thinned down and partially removed until the first metal gate structure 124 is exposed, in accordance with some embodiments. As a result, a semiconductor device structure 1000 is formed as shown in FIG. 11 in accordance with some embodiments. As shown in FIG. 11, after thinning down the second dielectric layer 144, the second conductive portion 242 of the second metal electrode of the second metal gate structure 224 is covered by the second dielectric layer 144 remaining in the second trench 218, in accordance with some embodiments.

Figure 12:
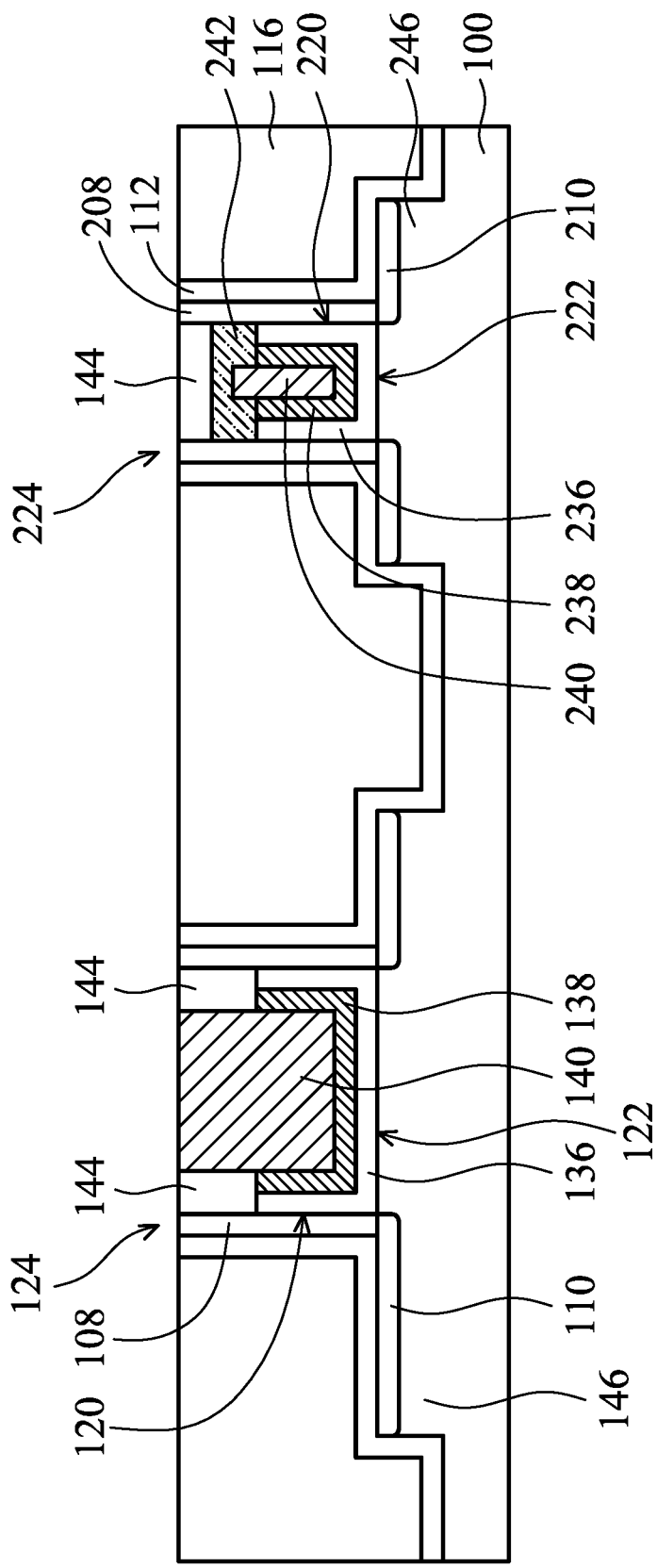
FIG. 12 is a cross-sectional view of a semiconductor device structure in accordance with some other embodiments of the present disclosure.

FIG. 12 is a cross-sectional view of a semiconductor device structure 2000 in accordance with some other embodiments of the present disclosure. As shown in FIG. 12, the semiconductor substrate 100 further includes a first fin structure 146 and a second fin structure 246, in accordance with some embodiments. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

In some embodiments, the first fin structure 146 and the second fin structure 246 are formed by etching into the semiconductor substrate 100. The semiconductor substrate 100 is partially removed to form recesses (or trenches). A photolithography process and an etching process may be used to form the recesses. As a result, the first fin structure 146 and the second fin structure 246 are formed between the recesses.

Afterwards, as shown in FIG. 12, the first metal gate structure 124 is formed over the first fin structure 146, in accordance with some embodiments. As shown in FIG. 12, the second metal gate structure 224 is formed over the second fin structure 246, in accordance with some embodiments. In some embodiments, the first metal gate structure 124 and the second metal gate structure 224 are formed by the same or similar methods as the methods shown in FIGS. 1-11 and will not be repeated for the sake of brevity. As shown in FIG. 12, the two first spacers 108 are formed over the first fin structure 146, in accordance with some embodiments. As shown in FIG. 12, the two second spacers 208 are formed over the second fin structure 246, in accordance with some embodiments. As shown in FIG. 12, the two first source/drain portions 110 are formed in the first fin structure 146, in accordance with some embodiments. As shown in FIG. 12, the two second source/drain portions 210 are formed in the second fin structure 246, in accordance with some embodiments.

Embodiments of the disclosure use the etching-depositing-etching processes to form the first metal electrode, the first work function layer, the second work function layer and the second metal electrode of the second metal gate structure. As a result, in some embodiments, the second metal electrode of the second metal gate structure includes the first conductive portion and the second conductive portion, and the amount of metal in the second metal electrode is increased. Therefore, the resistance of the second metal gate structure may be reduced, in accordance with some embodiments.

Embodiments of the disclosure use the etching-depositing-etching processes to form the first metal electrode, the first work function layer, the second work function layer and the second metal electrode of the second metal gate structure. As a result, the first work function layer and the second work function layer may be formed by two different etching processes. Therefore, both the first work function layer and the second work function layer may reach the designed height without over-etching.

In accordance with some embodiments, a semiconductor device structure is provided. The semiconductor device structure includes a substrate, a dielectric layer over the substrate, a first metal gate structure in the dielectric layer and having a first width and a second metal gate structure in the dielectric layer and having a second width. The first width is greater than the second width. The first metal gate structure includes a first metal electrode, and the second metal gate structure includes a second metal electrode. The second metal electrode includes a first conductive portion having a third width and a second conductive portion over the first conductive portion and having a fourth width. The fourth width is greater than the third width. The semiconductor device structure also includes two first source/drain portions at opposite sides of the first metal gate structure, and two second source/drain portions at opposite sides of the second metal gate structure.

In accordance with some embodiments, a method for forming a semiconductor device structure is provided. The method includes forming a first dielectric layer over a substrate. The first dielectric layer has a first trench with a first width and a second trench with a second width that is less than the first width. The method also includes forming a first metal gate structure in the first trench and forming a second metal gate structure in the second trench. The first metal gate structure includes a first metal material electrode, and the second metal gate structure includes a second metal material electrode. The method further includes forming a mask structure covering the first metal gate structure and exposing the second metal gate structure, and etching the second metal material electrode of the second metal gate structure. A remaining portion of the second metal material electrode forms a first conductive portion of the second metal gate structure. The method also includes removing the mask structure, and depositing a metal layer over the first dielectric layer, the first trench and the second trench. The metal layer fills the second trench and covers the first conductive portion. The method further includes etching the metal layer. A remaining portion of the metal layer over the first conductive portion in the second trench forms a second conductive portion over the first conductive portion. The first conductive portion and the second conductive portion together form a second metal electrode of the second metal gate structure. The first conductive portion has a third width, and the second conductive portion has a fourth width, wherein the fourth width is greater than the third width.

In accordance with some embodiments, a method for forming a semiconductor device structure is provided. The method includes forming a first dummy gate structure and a second dummy gate structure over a substrate, forming two first spacers at opposite sides of the first dummy gate structure, forming two second spacers at opposite sides of a second dummy gate structure, forming a first dielectric layer surrounding the two first spacers and the two second spacers, and removing the first dummy gate structure and the second dummy gate structure to respectively form a first trench with a first width and a second trench with a second width that is less than the first width in the first dielectric layer. The first trench exposes first sidewalls of the first spacers and a first portion of the substrate, and the second trench exposes second sidewalls of the second spacers and a second portion of the substrate. The method also includes forming a first metal gate structure in the first trench, and forming a second metal gate structure in the second trench. The second metal gate structure includes a second gate dielectric material layer conformally lining the second sidewall of the second spacers and the second portion of the substrate, a second work function material layer conformally lining the second gate dielectric material layer, and a second metal material electrode over the second work function material layer. The method also includes forming a mask structure covering the first metal gate structure and exposing the second metal gate structure, and etching the second gate dielectric material layer, the second work function material layer, and the second metal material electrode of the second metal gate structure. A remaining portion of the second gate dielectric material layer forms a second gate dielectric layer lining the second sidewall of the second spacers and the second portion of the substrate. A remaining portion of the second work function material layer forms a second work function layer conformally lining the second gate dielectric layer. A remaining portion of the second metal material electrode forms a first conductive portion of the second metal gate structure. The method further includes removing the mask structure, and depositing a metal layer over the first dielectric layer, the first trench and the second trench. The metal layer fills the second trench and covers the first conductive portion. The method also includes etching the metal layer. A remaining portion of the metal layer over the first conductive portion in the second trench forms a second conductive portion over the first conductive portion. The first conductive portion and the second conductive portion together form a second metal electrode of the second metal gate structure.

In accordance with some embodiments, a method for forming a semiconductor device structure is provided. The method includes forming a first dielectric layer over a substrate, and forming a first metal gate structure in the first dielectric layer. The first metal gate structure includes a first metal electrode. The method includes forming a second metal gate structure in the first dielectric layer, and the second metal gate structure includes a second gate dielectric layer and a second metal electrode over the second gate dielectric layer. The method also includes forming a mask structure covering the first metal gate structure and exposing the second metal gate structure. The method also includes etching a portion of the second gate dielectric layer and a portion of the second metal electrode of the second metal gate structure to form a first conductive portion extending above a top surface of the second gate dielectric layer. The method includes forming a metal layer over the first conductive portion, and the metal layer has a recess, and a top portion of the first conductive portion extends into the recess.

In accordance with some embodiments, a method for forming a semiconductor device structure is provided. The method includes forming a first dielectric layer over a substrate, and the first dielectric layer has a first trench with a first width and a second trench with a second width that is less than the first width. The method includes forming a first metal gate structure in the first trench, and the first metal gate structure includes a first metal material electrode. The method also includes forming a second metal gate structure in the second trench, and the second metal gate structure includes a second metal material electrode. The method further includes forming a mask structure covering the first metal gate structure and exposing the second metal gate structure. The method includes etching the second metal material electrode of the second metal gate structure, and a remaining portion of the second metal material electrode forms a first conductive portion of the second metal gate structure. The method includes removing the mask structure, and depositing a metal layer over the first dielectric layer, the first trench and the second trench. The metal layer fills the second trench and covers the first conductive portion. The method includes etching the metal layer, wherein a remaining portion of the metal layer is formed on a top surface and a sidewall surface of the first conductive portion.

In accordance with some embodiments, a method for forming a semiconductor device structure is provided. The method includes forming a first dummy gate structure and a second dummy gate structure over a substrate, and forming a first dielectric layer surrounding the first dummy gate structure and the second dummy gate structure. The method includes removing the first dummy gate structure and the second dummy gate structure to respectively form a first trench and a second trench. The method also includes forming a first metal gate structure in the first trench, and forming a second metal gate structure in the second trench. The second metal gate structure includes a second work function material layer over a second gate dielectric material layer, and a second metal material electrode over the second work function material layer. The method includes forming a mask structure covering the first metal gate structure and exposing the second metal gate structure. The method also includes etching the second gate dielectric material layer, the second work function material layer, and the second metal material electrode, and a remaining portion of the second metal material electrode forms a first conductive portion of the second metal gate structure, and a top surface and a sidewall surface of the first conductive portion is exposed. The method includes removing the mask structure, and depositing a metal layer over the first dielectric layer. The metal layer fills the second trench and covers the first conductive portion. The method includes etching the metal layer, wherein the metal layer is formed on the exposed top surface and the exposed sidewall surface of the first conductive portion.

In accordance with some embodiments, a method for forming a semiconductor device structure is provided. The method includes forming a first gate structure over a substrate, and the first gate structure includes a first metal electrode. The method includes forming a second gate structure adjacent to the first gate structure, and the second gate structure includes a second metal electrode. The method also includes forming a mask structure covering the first gate structure and exposing the second gate structure, and etching a portion of the second metal electrode of the second gate structure to form an extending conductive portion. The method includes forming a metal layer over the first gate structure and the extending conductive portion, and etching the metal layer, such that no metal layer is remaining over the first gate structure, and a remaining portion of the metal layer is over the extending conductive portion.

In accordance with some embodiments, a method for forming a semiconductor device structure is provided. The method includes forming a first dielectric layer over a substrate, wherein the first dielectric layer has a first trench with a first width and a second trench with a second width that is less than the first width, and forming a first gate structure in the first trench, and the first gate structure includes a first work function layer and a first metal electrode. The method includes forming a second gate structure in the second trench, and the second gate structure includes a second work function layer and a second metal electrode. The method includes forming a mask structure covering the first gate structure and exposing the second gate structure. The method includes etching the second work function layer and second metal electrode of the second gate structure, and a top surface of the second metal electrode is higher than a top surface of the second work function layer. The method includes removing the mask structure, and depositing a metal layer over the first gate structure, the second gate structure, the first dielectric layer. The metal layer fills the second trench and covers the second metal electrode. The method includes etching the metal layer and etching the first work function layer and the first metal electrode, and a top surface of the first metal electrode is higher than a top surface of the first work function layer.

In accordance with some embodiments, a method for forming a semiconductor device structure is provided. The method includes forming a first gate structure over a substrate, and the first gate structure includes a first metal electrode. The method includes forming a second gate structure adjacent to the first gate structure, and the second gate structure includes a second metal electrode. The method includes forming a mask structure covering the first gate structure and exposing the second gate structure, and etching a portion of the second metal electrode of the second gate structure to form a recess. The method includes forming a metal layer in the recess and over the first metal fate structure, an removing a portion of the metal layer, wherein a remaining portion of the metal layer is on the second metal electrode to form a T-shaped structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first gate structure over a substrate, wherein the first gate structure comprises a first metal electrode;
   forming a second gate structure adjacent to the first gate structure, wherein the second gate structure comprises a second metal electrode;
   forming a mask structure covering the first gate structure and exposing the second gate structure;
   etching a portion of the second metal electrode of the second gate structure to form an extending conductive portion;
   forming a metal layer over the first gate structure and the extending conductive portion; and
   etching the metal layer, such that no metal layer is remaining over the first gate structure, and a remaining portion of the metal layer is over the extending conductive portion.

2. The method as claimed in claim 1, further comprising:
   forming a dielectric layer over the first gate structure, wherein the dielectric layer is in direct contact with a top surface and a sidewall surface of the first gate structure.

3. The method as claimed in claim 2, further comprising:
   forming a S/D structure adjacent to the first gate structure, wherein a sidewall surface of the S/D structure is aligned with a sidewall surface of the dielectric layer.

4. The method as claimed in claim 1, further comprising:
   forming a second gate spacer on a sidewall of the second gate structure, wherein a top surface of the remaining portion of the metal layer is lower than a top surface of the second gate spacer.

5. The method as claimed in claim 4, wherein the remaining portion of the metal layer is in direct contact with the second gate spacer.

6. The method as claimed in claim 1, wherein the first gate structure further comprises a first gate dielectric layer, and a portion of the first gate dielectric layer is removed while etching the metal layer.

7. The method as claimed in claim 1, further comprising:
   etching the metal layer simultaneously etching the first metal electrode, wherein a height of the first metal electrode is higher than a height of the remaining portion of the metal layer.

8. The method as claimed in claim 1, wherein the remaining portion of the metal layer and the extending conductive portion form a T-shaped structure.

9. A method for forming a semiconductor device structure, comprising:
   forming a first dielectric layer over a substrate, wherein the first dielectric layer has a first trench with a first width and a second trench with a second width that is less than the first width;
   forming a first gate structure in the first trench, wherein the first gate structure comprises a first work function layer and a first metal electrode;
   forming a second gate structure in the second trench, wherein the second gate structure comprises a second work function layer and a second metal electrode;
   forming a mask structure [covering the first gate structure and exposing the second gate structure;
   etching the second work function layer and second metal electrode of the second gate structure, wherein a top surface of the second metal electrode is higher than a top surface of the second work function layer;
   removing the mask structure;
   depositing a metal layer over the first gate structure, the second gate structure, the first dielectric layer, wherein the metal layer fills the second trench and covers the second metal electrode; and etching the metal layer and etching the first work function layer and the first metal electrode, wherein a top surface of the first metal electrode is higher than a top surface of the first work function layer.

10. The method as claimed in claim 9, wherein a remaining metal layer covers the second metal electrode, and a top portion of the second metal electrode is embedded in the remaining metal layer.

11. The method as claimed in claim 9, further comprising:
forming a dielectric layer on the first work function layer, wherein the dielectric layer has a sidewall surface in direct contact with the first metal electrode and a bottom surface in direct contact with the first work function layer.

12. The method as claimed in claim 11, wherein a top surface of the dielectric layer is substantially level with a top surface of the first metal electrode.

13. The method as claimed in claim 9, further comprising:
forming a dielectric layer on a remaining metal layer on the second metal electrode, wherein the dielectric layer is not in direct contact with the second work function layer.

14. The method as claimed in claim 9, wherein the metal layer and the second metal electrode form a T-shaped structure.

15. The method as claimed in claim 9, further comprising:
forming two second spacers adjacent to the second gate structure, wherein the second metal electrode is separated from the second spacers by the metal layer.

16. A method for forming a semiconductor device structure, comprising:
forming a first gate structure over a substrate, wherein the first gate structure comprises a first metal electrode;
forming a second gate structure adjacent to the first gate structure, wherein the second gate structure comprises a second metal electrode;
forming a spacer on a sidewall surface of the second gate structure;
forming a mask structure covering the first gate structure and exposing the second gate structure;
etching a portion of the second metal electrode of the second gate structure to form a recess, wherein the spacer is exposed by the recess;
forming a metal layer in the recess and over the first gate structure; and
removing a portion of the metal layer, wherein a remaining portion of the metal layer is on the second metal electrode to form a T-shaped structure.

17. The method as claimed in claim 16, further comprising:
removing a portion of the first metal electrode when removing the portion of the metal layer, wherein a top surface of the first metal electrode is higher than a top surface of the T-shaped structure.

18. The method as claimed in claim 16, further comprising:
forming two dielectric layers on sidewall surfaces of the first metal electrode, wherein top surfaces of the two dielectric layers are substantially leveled with a top surface of the first metal electrode.

19. The method as claimed in claim 16, wherein the second gate structure has a second width, the first gate structure has a first width, and the first width is greater than the second width.

20. The method as claimed in claim 16, further comprising:
forming two second spacers adjacent to the second gate structure, wherein the second metal electrode is separated from the second spacers by the metal layer.

* * * * *